(12) United States Patent
Cha et al.

(10) Patent No.: US 9,196,852 B2
(45) Date of Patent: Nov. 24, 2015

(54) METHOD FOR MANUFACTURING CONSTITUENT LAYERS OF POLYMER SOLAR CELLS BY ROLL TO ROLL COATING

(71) Applicant: ATOMIC ENERGY COUNCIL-INSTITUTE OF NUCLEAR ENERGY RESEARCH, Taoyuan County (TW)

(72) Inventors: Hou-Chin Cha, Taoyuan County (TW); Yu-Ching Huang, Taoyuan County (TW); Chih-Min Chuang, Taoyuan County (TW); Cheng-Wei Chou, Taoyuan County (TW); De-Han Lu, Taoyuan County (TW); Yeong-Der Lin, Taoyuan County (TW); Charn-Ying Chen, Taoyuan County (TW); Cheng-Si Tsao, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 14/065,518

(22) Filed: Oct. 29, 2013

(65) Prior Publication Data

US 2015/0056735 A1 Feb. 26, 2015

(30) Foreign Application Priority Data

Aug. 20, 2013 (TW) .............................. 102129746 A

(51) Int. Cl.
*B05D 5/12* (2006.01)
*H01L 51/44* (2006.01)
*B05D 1/26* (2006.01)
*H01L 51/00* (2006.01)
*B05D 7/00* (2006.01)
*H01L 51/42* (2006.01)

(52) U.S. Cl.
CPC ................ *H01L 51/442* (2013.01); *B05D 1/26* (2013.01); *B05D 1/265* (2013.01); *H01L 51/0004* (2013.01); *B05D 5/12* (2013.01); *B05D 7/546* (2013.01); *B05D 7/586* (2013.01); *H01L 51/4253* (2013.01)

(58) Field of Classification Search
USPC ............................................ 427/74, 355–358
See application file for complete search history.

(56) References Cited

U.S. PATENT DOCUMENTS

| 8,158,881 | B2 * | 4/2012 | Brabec et al. | .................. 136/263 |
| 2009/0188558 | A1 * | 7/2009 | Jen et al. | ........................ 136/256 |
| 2011/0030789 | A1 * | 2/2011 | Krebs | ............................ 136/258 |

(Continued)

OTHER PUBLICATIONS

Krebs et al. "A roll-to-roll process to flexible polymer soalr cells: model studies manufacture and operational stability studies", Journal of Material Chemistry, vol. 19, pp. 5442-5451.*

*Primary Examiner* — Brian K Talbot
(74) *Attorney, Agent, or Firm* — Rosenberg, Klein & Lee

(57) ABSTRACT

A method for manufacturing membrane layers of organic solar cells by roll to roll coating utilizes a roll to roll process for manufacturing an electron transferring layer and an active layer of the organic solar cells is disclosed. The roll to roll process adopted by the method cooperates with a particular solvent and accompanies a parameter control such as temperature and processing time during the sintering and baking steps. The method utilizes a slot-die coating technique in the interim, whereby a membrane layer of the solar cells can be manufactured with a large area for reducing the cost, and the formed membrane layers can have a good efficiency.

10 Claims, 3 Drawing Sheets

(56) References Cited

U.S. PATENT DOCUMENTS

2011/0088747 A1* 4/2011 Alstrup et al. ............... 136/244
2011/0186112 A1* 8/2011 Aernouts et al. ............. 136/249
2013/0019937 A1* 1/2013 So et al. ...................... 136/256
2013/0136917 A1* 5/2013 Dastoor et al. .............. 428/323
2014/0202517 A1* 7/2014 Kippelen et al. ............. 136/244

* cited by examiner

METHOD FOR MANUFACTURING CONSTITUENT LAYERS OF POLYMER SOLAR CELLS BY ROLL TO ROLL COATING

BACKGROUND OF THE INVENTION

1. Field of the Invention

The present invention relates to a method for manufacturing membrane layers of organic solar cells, in particular to a method for manufacturing an active layer and an electron transferring layer of organic solar cells by utilizing a roll to roll process (R2R) and combining a slot-die coating technique so as to obtain absolute superiorities in manufacturing efficiency and cost reducing.

2. Description of the Related Art

A research in solar cells is an expectant direction of the renewable energy sources. Although most of the commercialized products utilize the silicon as their main material, the organic solar cells still attract the attention of the industrial and academic fields due to the simple manufacturing procedure, the low manufacturing cost, the light material, and the flexibility.

While manufacturing the organic solar cell, a membrane of the solar cell is manufactured by spin coating which renders the membrane provide with a better flatness and uniformity. However, the spin coating is restricted by being unable to be applied in the manufacture of the solar cell membrane with a large area but a small area, so that an innate choke point is existed in the consideration of reducing the cost in the future commercialization. Therefore, large-area proceeding methods are considered in the manufacture of the organic solar cells.

The R2R manufacturing process is a potential technique used for manufacturing organic solar cells with a large area and has a manufacture by cooperating with a flexible display in the industrial circles. Due to a soft property of the flexible display, the R2R manufacturing process cooperates with an operation of the flexible display so as to produce the displays with the advantages of plasticity, light weight, and bump-resistance.

The developing research of the solar cell field tries to attempt the R2R manufacturing process. However, the technique regarding to how the R2R manufacturing process functions in the manufacture of the solar cell for reducing the manufacturing cost and providing a good efficiency of the membrane layer formed by the manufacture still needs an improvement.

SUMMARY OF THE INVENTION

It is an object of the present invention to provide a method for manufacturing membrane layers of organic solar cells by roll to roll coating, which utilizes a slot-die coating technique to quickly form an electron transferring layer and an active layer of the organic solar cells in a large-area via R2R manufacture process so as to reduce the manufacturing cost of the organic solar cells.

It is a further object of the present invention to provide a method for manufacturing membrane layers of the organic solar cells by slot-die coating, which controls the parameter conditions of the electron transferring layer and the active layer and the use of the specific solvent in the R2R manufacturing process, so that the formed membrane layers provide with a better efficiency.

It is a further object of the present invention to provide a method for manufacturing membrane layers of the organic solar cells by roll to roll coating, which cooperates with the slot-die coating technique, so that a mixed material used for manufacturing the electron transferring layer and the active layer is able to coat in a large area, high uniformity, and high material utility ratio for increasing a quality of the membrane layers.

The present invention in conformity with the method for manufacturing membrane layers of the organic solar cells by roll to roll coating comprises steps of unwinding a soft substrate, and the soft substrate having a cathode layer disposed thereon; slot-die coating an electron transferring layer on the cathode layer, and a material of the electron transferring layer including one of the groups consisting of zinc oxide (ZnO) and aluminum doped ZnO (AZO) and polyethylenimine ethoxylated (PEIE); sintering the electron transferring layer; slot-die coating an active layer on the electron transferring layer and baking the active layer concurrently, and a material of the active layer being made by mixing O-xylene as a solvent; and rewinding the soft substrate. By the execution of the above-mentioned steps, the membrane layers of the organic solar cells are successfully formed by cooperating with the R2R manufacturing process.

DETAILED DESCRIPTION OF THE PREFERRED EMBODIMENTS

Figure 1:
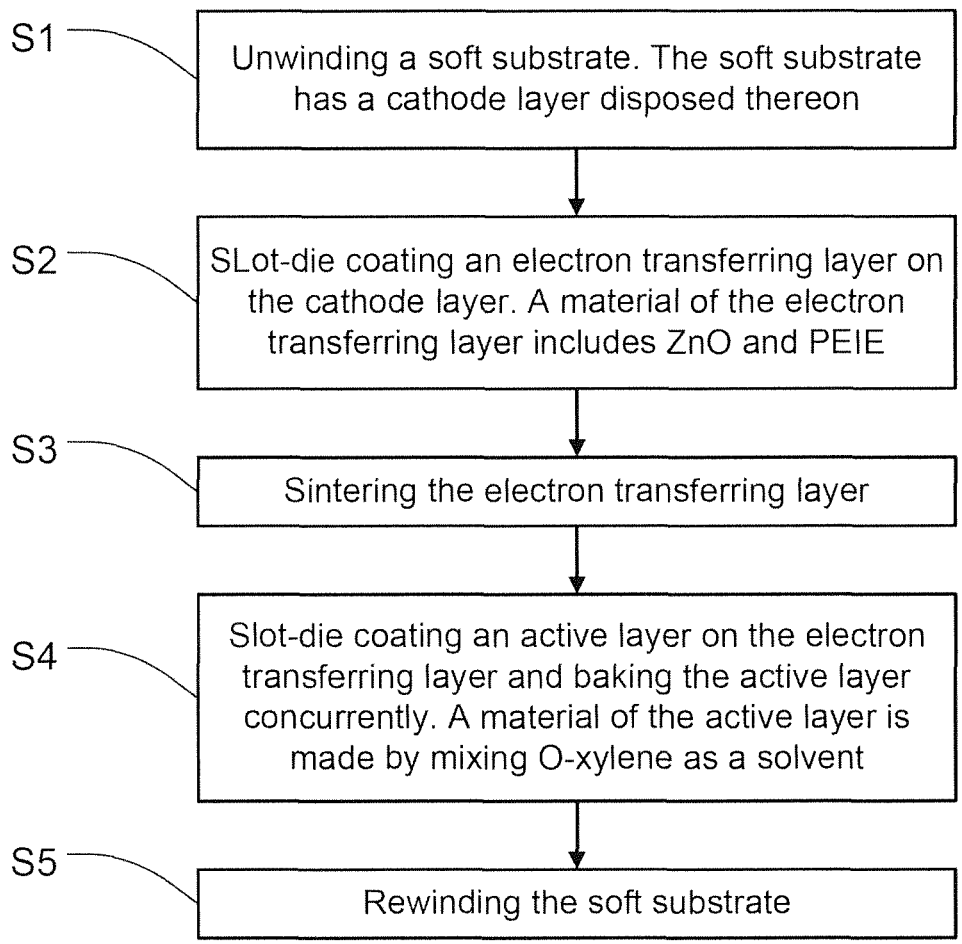
FIG. 1 is a flow view showing steps of a preferred embodiment of the present invention.

Before describing in detail, it should note that the like elements are denoted by the similar reference numerals throughout disclosure.

Referring to FIG. 1, a flow view of the present invention is shown. As shown in the figure, the present invention comprises steps of:

Step S1: Unwinding a soft substrate. The soft substrate has a cathode layer disposed thereon;

Step S2: Slot-die coating an electron transferring layer on the cathode layer. A material of the electron transferring layer includes zinc oxide (ZnO) and polyethylenimine ethoxylated (PEIE);

Step S3: Sintering the electron transferring layer;

Step S4: Slot-die coating an active layer on the electron transferring layer and baking the active layer concurrently. A material of the active layer is made by mixing O-xylene as a solvent; and Step S5: Rewinding the soft substrate.

Figure 2:
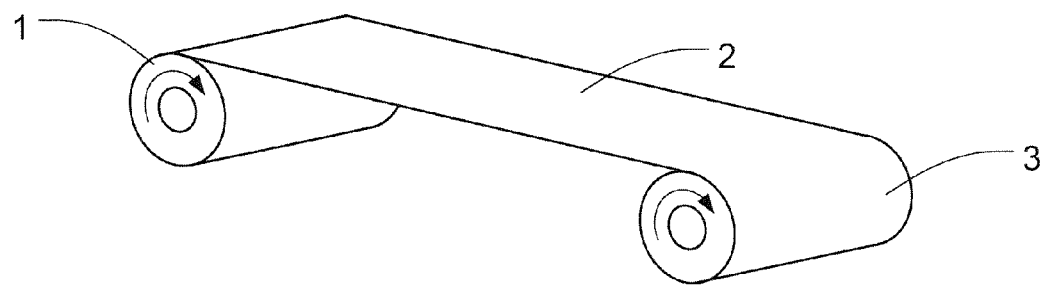
FIG. 2 is a schematic view showing a structure of a R2R manufacturing process used in the present invention.
Figure 3:
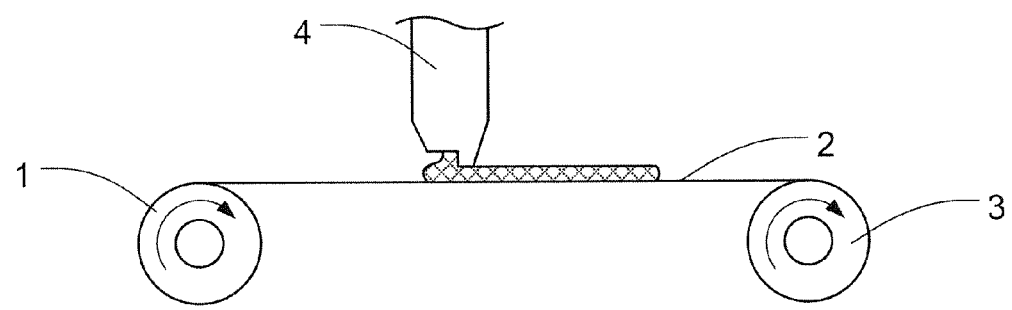
FIG. 3 is a schematic view showing a structure of the R2R manufacturing process used in the present invention combining with a slot-die coating.

The disclosed method of the present invention is operated under a R2R institution. Referring to FIGS. 2 and 3, a simple structure of a R2R manufacturing process is shown. The structure comprises an unwinding portion 1, a processing portion 2, and a rewinding portion 3. A soft material, such as a soft sheet material, is unwound from the cylindrical unwinding portion 1. A section of the processing portion 2 cooperates with a coating portion 4 for processing a surface of the soft sheet material, thereby giving the material a function of particular uses. Finally, the soft sheet material is rewound in a cylindrical shape. The present invention belongs to a continuous-manufacturing method with high efficiency and low cost.

Figure 4:
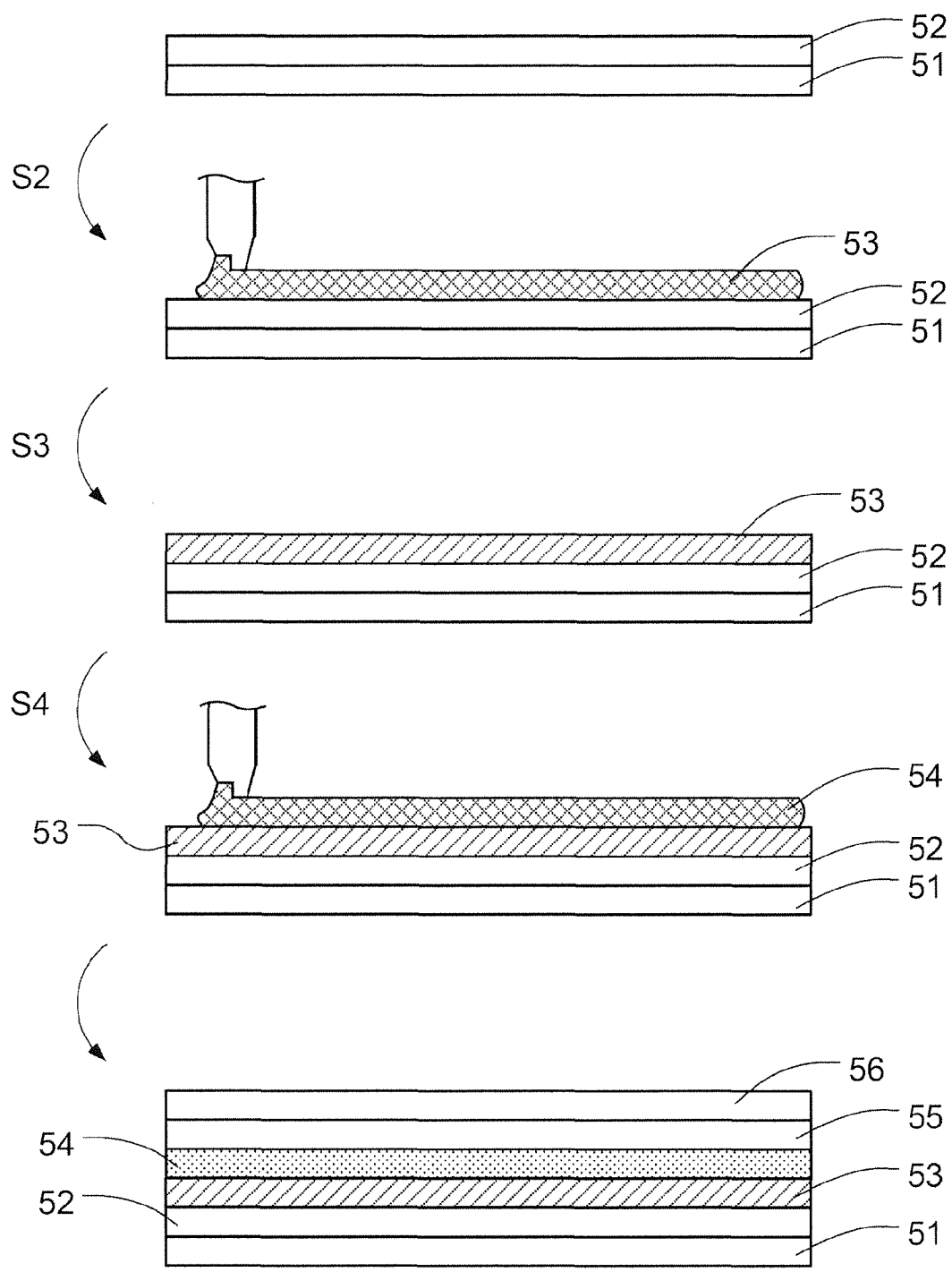
FIG. 4 is schematic view showing a changing procedure of a structure of membrane layers of solar cells of the present invention.

Referring to FIG. 4, a change of the structure is shown. The step S1 unwinds a soft substrate 51 which is flexible and can be utilized in the R2R manufacturing process. The soft substrate includes a cathode layer 52 which is defined as a transparent cathode end of the organic solar cell. A material of the cathode layer 52 includes a conductive indium tin oxide (ITO) which is forming on the soft substrate 51 by depositing.

The soft substrate 51 with the cathode layer 52 is unwound, and then the step S2 is processed. The present invention adopts a slot-die coating method so that the electron transferring layer 53 is formed on the cathode layer 52. A function of the electron transferring layer 53 is to assist an electron generated by a separation of an electron and an electron hole in the active layer so as to pass through the electron transferring layer 53 for being transferred to the cathode layer 52.

Herein, a material of the electron transferring layer includes the ZnO defined as a principal part and the PEIE defined to modify the material. The PEIE is pre-diluted by using a 0.4 weight percent and a 0.358 volume percent in 2-methoxyethanol as a dilute solvent before being processed the mixing and modifying, and then the diluted solvent is mixed with the ZnO. The ZnO is mixed with a 20 volume percent of PEIE before coating and then diluted with different solvents for attaining a preferable membrane layer structure. By an experimental test, an isopropyl alcohol (IPA) is selected as a preferable solvent, and a preferable diluted proportion thereof is (ZnO+PEIE): IPA=1:10. The mixture of the ZnO and PEIE diluted by the IPA is spread on the cathode layer 52 via the slot-die coating method which has high uniformity, high material utility rate, and large applicable viscous scope of the coating material, and is able to control a coating border thereof. An operation of the slot-die coating is shown in FIG. 3.

The mixture of the ZnO, PEIE, and IPA is coated on the cathode layer 52, and then the step S3 is processed so that the materials are sintered for completing a production of the electron transferring layer 53. A condition of the sintering in this step is controlled by a temperature at 150° C., and an effect of a processing time to the battery efficiency is shown in the following table 1. The processing time is preferable maintained for 60 minutes. After the electron transferring layer 53 is sintered, the PEIE is evenly spread in a ZnO structure under a dispersion of the IPA. Surface defects of the ZnO modified by the PEIE are effectively surrounded and embellished by the PEIE for forming into a passivation, thereby solving the defects on the surface so that a combination of the electron and the electron hole will not be occurred and the processing efficiency of the electron transferring layer 53 is enhanced.

TABLE 1

A comparison between the effects on the efficiencies affected from different sintering processing time.

| ZnO Sintering processing time (150° C.) | Jsc (mA/cm$^2$) | Voc (V) | F.F. (%) | P.C.E. (%) |
| --- | --- | --- | --- | --- |
| 10 minutes | 3.548 | 0.329 | 24.2 | 0.28 |
| 30 minutes | 7.781 | 0.564 | 37.9 | 1.67 |
| 60 minutes | 8.062 | 0.581 | 40.3 | 1.89 |

The present invention adopts the ZnO as one of the materials of the electron transferring layer 53, and the ZnO can be replaced by an aluminum doped ZnO (AZO) which is mixed with a 20 volume percent of PEIE. Herein, deionized water (DI) is adopted as the solvent in this preferred embodiment, a diluted proportion is preferably defined as (AZO+PEIE): DI=1:1, and a sintering condition is preferably controlled at a temperature at 150° C. and a processing time for 10 minutes. The following table 2 shows a comparison between the effects on the efficiency by using the electron transferring layer 53 which adopts the ZnO and the AZO as the material to mix a 20 volume percent of PEIE.

TABLE 2

A comparison between the effects on the efficiency by mixing the PEIE.

| ETL structure | Jsc (mA/cm$^2$) | Voc (V) | F.F. (%) | P.C.E. (%) |
| --- | --- | --- | --- | --- |
| ZnO | 6.510 | 0.530 | 49.4 | 1.70 |
| ZnO + 20 vol. % PEIE | 7.265 | 0.583 | 50.8 | 2.15 |
| AZO | 7.122 | 0.578 | 50.2 | 2.06 |
| AZO + 20 vol. % PEIE | 7.415 | 0.581 | 54.5 | 2.35 |

After the electron transferring layer 53 is formed, the step S4 is processed for slot-die coating an active 54 on the electron transferring layer 53. A material of the active layer 54 is not limited, such as using a common mixture of P3HT (Poly (3-hexyl-thiophene-2,5-diyl)):PCBM ([6,6]-phenyl-C61-butyric acid methyl ester) or a combination of PTQ1 (poly[2,3-bis-(3-octyloxy-phenyl)quinoxaline-5,8-diyl-alt-thiop-thiophene-2,5-diyl]):PC71BM ([6,6]-phenyl-C71-butyric acid methyl ester), so that the electron and the electron hole can separate a surface mixed by the above-mentioned materials.

In the step of manufacturing the active layer 54, the technological feature is to mix a non-toxic chemical O-xylene as a solvent and desiccate the active layer 54 into a membrane by a R2R oven with a baking temperature ranged from 90 to 150° C. while the active layer 54 is coated. As shown in the following table 3, the present invention adopts O-xylene as the solvent, which has a better effect than the effect by using chlorobenzene (CB) as the solvent of the active layer for the enhancement of the battery efficiency. The baking temperature of the active layer 54 in this step causes different crystalline properties with macromolecules so that a photovoltaic power conversion efficiency of the solar cell is affected. If the baking temperature is set at a low temperature, such as 30° C. and 70° C., the crystalline quality and the photovoltaic power conversion efficiency of the active layer 54 of the solar cell product are worse and cannot reach the standard. Further, in view of the heat resistance of the soft substrate 51, the active layer 54 is not baked under a high temperature higher than 150° C. The photovoltaic power conversion efficiency of the solar cell is greatly increased by cooperating with the conventional thermal annealing process of the active layer. The following table 4 shows a comparison of the effects on different active layer baking temperature to the battery efficiency while using the O-xylene as the solvent of the active layer 54, thereby proving that the selected temperature scope of the present invention is able to obtain products with higher photovoltaic power conversion efficiency.

TABLE 3

A comparison of the efficiencies by using different solvents.

| Active layer solvent | Jsc (mA/cm²) | Voc (V) | F.F. (%) | P.C.E. (%) |
|---|---|---|---|---|
| CB | 7.276 | 0.598 | 61.8 | 2.69 |
| o-xylene | 7.603 | 0.592 | 62.1 | 2.80 |

TABLE 4

A comparison of the efficiencies in different baking temperature of the active layer.

| Baking temperature | Jsc (mA/cm²) | Voc (V) | F.F. (%) | P.C.E. (%) |
|---|---|---|---|---|
| 30° C. | 6.17 | 0.569 | 56.3 | 1.97 |
| 70° C. | 6.358 | 0.558 | 51.3 | 1.82 |
| 110° C. | 7.603 | 0.592 | 62.1 | 2.80 |
| 150° C. | 7.539 | 0.599 | 58.9 | 2.66 |

Finally, in the step S5, the soft substrate 51 is wound at the rewinding portion 3 of the R2R manufacture procedure. The wound soft substrate 51 not only includes the cathode layer 52 in the unwinding process but also the electron transferring layer 53 and the active layer 54 sequentially formed thereon by quickly slot-die coating with a large area in the above-processed steps.

The wound half-finished product of the solar cell is able to be processed for forming a hole transferring layer 55 and an anode layer 56 on the active layer 54, thereby completing the manufacture of the solar cell. A material of the hole transferring layer 55 is diversified, which can be a mixture of poly(3,4-ethylenedioxythiophene)(PEDOT) and poly(styrenesulfonate), or other materials like Vanadium(V)oxide ($V_2O_5$) and molybdenum trioxide ($MoO_3$) for assisting a transmission of the electron hole. Further, the anode layer 56 adopts a steadier material, such as the silver (Ag), as a material thereof.

By the above-mentioned steps, the R2R manufacturing procedures processes a manufacture of the membrane layer of the organic solar cell, cooperates with a precise control of parameter condition of the procedure, and attains the increase of the manufacturing efficiency by manufacturing the membranes in a large area so as to reduce the manufacturing cost of the solar cell and benefit the advancement of the development and the popularization of the application. By cooperating with the particular solvent and adopting a slot-die coating technique, the sintering process of the electron transferring layer and the baking process of the active layer are sequentially completed by cooperating with the conventional thermal annealing process of the active layer for achieving the manufacture of the solar cell. The present invention which forms the electron transferring layer processed to reduce the surface defects and the crystallization control of the active layer according to the R2R manufacturing process attains an excellent performance of an electron transmission and photovoltaic power conversion efficiency, respectively. Under the principal points of the main development of the solar cell, such as reducing the cost and enhancing the efficiency, the present invention provides with a method full of industrial value for manufacturing membrane layers of organic solar cells by roll to roll coating.

While we have shown and described the embodiment in accordance with the present invention, it should be clear to those skilled in the art that further embodiments may be made without departing from the scope of the present invention.

We claim:

1. A method for manufacturing constituent layers of polymer solar cells by roll to roll coating comprising steps of:
   unwinding a soft substrate, said soft substrate having a cathode layer disposed thereon;
   slot-die coating a material of an electron transferring layer including zinc oxide and polyethylenimine ethoxylated (PEIE) on said cathode layer to form the electron transferring layer thereon by spreading PEIE evenly in a ZnO structure;
   sintering said electron transferring layer on said cathode layer;
   slot-die coating an active layer on said electron transferring layer and baking said active layer concurrently with a baking temperature ranged from 90 to 150° C., a material of said active layer being made by mixing O-xylene as a solvent; and
   rewinding said soft substrate.

2. The method as claimed in claim 1, wherein a material of said cathode layer is defined as indium tin oxide.

3. The method as claimed in claim 1, wherein in said step of slot-die coating said electron transferring layer on said cathode layer, said zinc oxide mixes a 20 volume percent of said polyethylenimine ethoxylated, and said polyethylenimine ethoxylated is pre-diluted by using a 0.4 weight percent thereof in 2-methoxyethanol.

4. The method as claimed in claim 3, wherein isopropyl alcohol is adopted as said solvent.

5. The method as claimed in claim 4, wherein after said zinc oxide is mixed with said polyethylenimine ethoxylated as a mixture, a volume ratio of said mixture to said isopropyl alcohol is 1:10.

6. The method as claimed in claim 1, wherein in said step of sintering said electron transferring layer, a sintering temperature is defined at 150° C., and a sintering time is set for 60 minutes.

7. A method for manufacturing constituent layers of polymer solar cells by roll to roll coating comprising steps of:
   unwinding a soft substrate, said soft substrate having a cathode layer disposed thereon;
   slot-die coating a material of an electron transferring layer including aluminum doped zinc oxide and polyethylenimine ethoxylated (PEIE) on said cathode layer to form the electron transferring layer thereon by spreading PEIE evenly in a ZnO structure;
   sintering said electron transferring layer on said cathode layer;
   slot-die coating an active layer on said electron transferring layer, a material of said active layer being made by mixing O-xylene as a solvent;
   baking said active layer with a baking temperature ranged from 90 to 150° C.; and
   rewinding said soft substrate.

8. The method as claimed in claim 7, wherein in said step of slot-die coating said electron transferring layer on said cathode layer, deionized water is adopted as said solvent.

9. The method as claimed in claim 8, wherein after said aluminum doped zinc oxide mixes with said polyethylenimine ethoxylated as a mixture, a volume ratio of said mixture to said deionized water is 1:1.

10. The method as claimed in claim 7, wherein in said step of sintering said electron transferring layer, a sintering temperature is defined at 150° C., and a sintering time is set for 10 minutes.

* * * * *